(12) United States Patent
Basol et al.

(10) Patent No.: US 7,923,281 B2
(45) Date of Patent: Apr. 12, 2011

(54) ROLL-TO-ROLL PROCESSING METHOD AND TOOLS FOR ELECTROLESS DEPOSITION OF THIN LAYERS

(75) Inventors: Bulent M. Basol, Manhattan Beach, CA (US); Serkan Erdemli, San Jose, CA (US); Jalal Ashjaee, Cupertino, CA (US)

(73) Assignee: SoloPower, Inc., San Jose, CA (US)

( * ) Notice: Subject to any disclaimer, the term of this patent is extended or adjusted under 35 U.S.C. 154(b) by 73 days.

(21) Appl. No.: 12/464,673

(22) Filed: May 12, 2009

(65) Prior Publication Data

US 2009/0246908 A1 Oct. 1, 2009

Related U.S. Application Data

(63) Continuation-in-part of application No. 11/735,430, filed on Apr. 13, 2007, now Pat. No. 7,585,547, and a continuation-in-part of application No. 12/037,076, filed on Feb. 25, 2008, now Pat. No. 7,541,067.

(60) Provisional application No. 60/744,827, filed on Apr. 13, 2006, provisional application No. 60/891,443, filed on Feb. 23, 2007.

(51) Int. Cl.
*H01L 31/18* (2006.01)

(52) U.S. Cl. ....... 438/62; 438/86; 438/484; 257/E21.07; 257/E31.027

(58) Field of Classification Search .................... 438/62, 438/86, 484; 257/E21.07, E31.027
See application file for complete search history.

(56) References Cited

U.S. PATENT DOCUMENTS

| | | | |
|---|---|---|---|
| 4,798,660 A | 1/1989 | Ermer et al. | |
| 4,915,745 A | 4/1990 | Pollock et al. | |
| 5,410,796 A | 5/1995 | Weeks, Jr. | |
| 5,476,811 A | 12/1995 | Fujii et al. | |
| 5,997,956 A | 12/1999 | Hunt et al. | |
| 6,048,442 A | 4/2000 | Kushiya et al. | |
| 6,092,669 A | 7/2000 | Kushiya et al. | |
| 6,537,845 B1 | 3/2003 | McCandless et al. | |
| 6,547,876 B2 | 4/2003 | Ferguson et al. | |
| 6,923,625 B2 | 8/2005 | Sparks | |
| 7,541,067 B2 * | 6/2009 | Basol | 427/430.1 |
| 7,585,547 B2 * | 9/2009 | Basol et al. | 427/248.1 |
| 2001/0006734 A1 | 7/2001 | Demiryont | |
| 2009/0162969 A1 * | 6/2009 | Basol | 438/95 |
| 2009/0246908 A1 * | 10/2009 | Basol et al. | 438/95 |
| 2009/0255461 A1 * | 10/2009 | Basol | 118/58 |
| 2010/0086699 A1 * | 4/2010 | Britt et al. | 427/421.1 |
| 2010/0087015 A1 * | 4/2010 | Britt et al. | 438/7 |
| 2010/0291727 A1 * | 11/2010 | Ashjaee | 438/62 |

* cited by examiner

*Primary Examiner* — George Fourson
(74) *Attorney, Agent, or Firm* — Pillsbury Winthrop Shaw Pittman LLP (57) ABSTRACT

A deposition method and a system are provided to deposit a CdS buffer layer on a surface of a solar cell absorber layer of a flexible workpiece from a process solution including all chemical components of the CdS buffer layer material. CdS is deposited from the deposition solution while the flexible workpiece is heated and elastically shaped by a heated shaping plate to retain the process solution on the solar cell absorber layer. The flexible workpiece is elastically shaped by pulling a back surface of the flexible workpiece into a cavity area in the heated shaping plate using an attractive force.

9 Claims, 5 Drawing Sheets

ROLL-TO-ROLL PROCESSING METHOD AND TOOLS FOR ELECTROLESS DEPOSITION OF THIN LAYERS

BACKGROUND OF THE INVENTION

This application is a continuation in part of U.S. application Ser. No. 11/735,430, filed Apr. 13, 2007, now U.S. Pat. No. 7,585,547, entitled "METHOD AND APPARATUS TO FORM THIN LAYERS OF MATERIALS ON A BASE," which claims priority to U.S. Provisional Application Ser. No. 60/744,827, filed Apr. 13, 2006; and this application is a continuation in part of U.S. application Ser. No. 12/037,076 filed Feb 25, 2008, now U.S. Pat. No. 7,541,067, entitled "METHOD AND APPARATUS FOR CONTINUOUS PROCESSING OF BUFFER LAYERS FOR GROUP IBIIIAVIA SOLAR CELLS", which claims priority to U.S. Provisional Application Ser. No. 60/891,443, filed Feb. 23, 2007, which applications are expressly incorporated by reference herein.

FIELD OF THE INVENTIONS

The present inventions relate to methods and apparatus for fabricating thin film solar cells employing a chemical bath deposited (CBD) buffer layer. More specifically the present inventions describe apparatus and methods for continuous manufacturing of Group IBIIIAVIA solar cells in a roll-to-roll fashion.

DESCRIPTION OF THE RELATED ART

Solar cells are photovoltaic (PV) devices that convert sunlight directly into electrical power. The most common solar cell material is silicon, which is in the form of single or polycrystalline wafers. However, the cost of electricity generated using silicon-based solar cells is higher than the cost of electricity generated by the more traditional methods. Therefore, since early 1970's there has been an effort to reduce cost of solar cells for terrestrial use. One way of reducing the cost of solar cells is to develop low-cost thin film growth techniques that can deposit solar-cell-quality absorber materials on large area substrates and to fabricate these devices using high-throughput, low-cost methods.

Group IBIIIAVIA compound semiconductors comprising some of the Group IB (Cu, Ag, Au), Group IIIA (B, Al, Ga, In, Tl) and Group VIA (O, S, Se, Te, Po) materials or elements of the periodic table are excellent absorber materials for thin film solar cell structures. Especially, compounds of Cu, In, Ga, Se and S which are generally referred to as CIGS(S), or $Cu(In,Ga)(S,Se)_2$ or $CuIn_{1-x}Ga_x(S_ySe_{1-y})_k$, where $0 \leq x \leq 1$, $0 \leq y \leq 1$ and k is approximately 2, have already been employed in solar cell structures that yielded conversion efficiencies approaching 20%. Absorbers containing Group IIIA element Al and/or Group VIA element Te also showed promise. Therefore, in summary, compounds containing: i) Cu from Group IB, ii) at least one of In, Ga, and Al from Group IIIA, and iii) at least one of S, Se, and Te from Group VIA, are of great interest for solar cell applications. It should be noted that although the chemical formula for the absorbers is often written as $Cu(In,Ga)(S,Se)_2$, a more accurate formula for the compound is $Cu(In,Ga)(S,Se)_k$, where k is typically close to 2 but may not be exactly 2. For simplicity we will, occasionally, continue to use the value of k as 2. It should be further noted that the notation "Cu(X, Y)" in the chemical formula means all chemical compositions of X and Y from (X=0% and Y=100%) to (X=100% and Y=0%). For example, Cu(In,Ga) means all compositions from CuIn to CuGa. Similarly, $Cu(In,Ga)(S,Se)_2$ means the whole family of compounds with Ga/(Ga+In) molar ratio varying from 0 to 1, and Se/(Se+S) molar ratio varying from 0 to 1.

Figure 1:
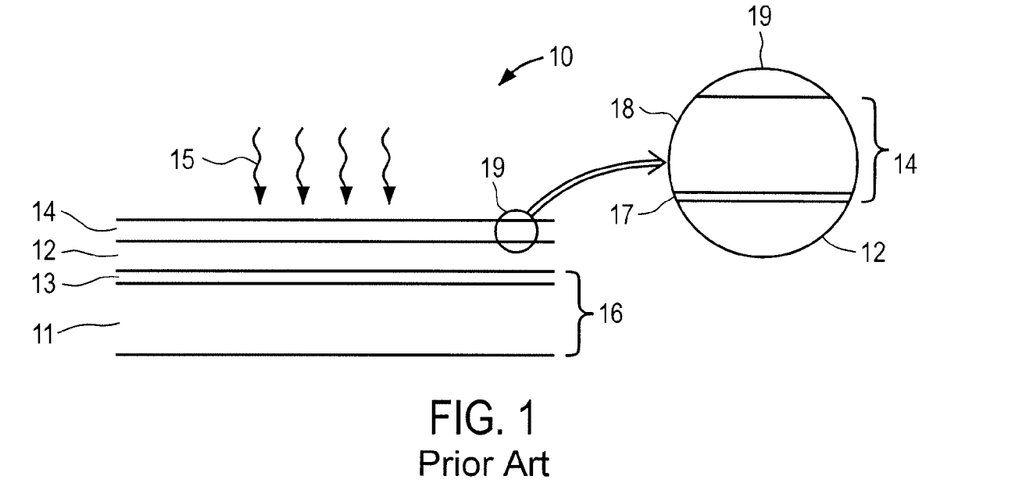
FIG. 1 is a cross-sectional view of a solar cell employing a Group IBIIIAVIA absorber layer.

The structure of a conventional Group IBIIIAVIA compound photovoltaic cell such as a $Cu(In,Ga,Al)(S,Se,Te)_2$ thin film solar cell is shown in FIG. 1. The device 10 is fabricated on a substrate 11, such as a sheet of glass, a sheet of metal (such as aluminum or stainless steel), an insulating foil or web, or a conductive foil or web. The absorber film 12, which includes a material in the family of $Cu(In,Ga,Al)(S,Se,Te)_2$, is grown over a conductive layer 13, which is previously deposited on the substrate 11 and which acts as the electrical contact to the device. The structure including the substrate 11 and the conductive layer 13 or the contact layer, is often called a base 16. Various conductive layers comprising Mo, Ta, W, Ti, and nitrides of these materials etc. have been used in the solar cell structure of FIG. 1. If the substrate itself is a properly selected conductive material, it is possible not to use a conductive layer 13, since the substrate 11 may then be used as the ohmic contact to the device. After the absorber film 12 is grown, a transparent layer 14 such as a CdS, ZnO or CdS/ZnO stack is formed on the absorber film. Radiation 15 enters the device through the transparent layer 14. Metallic grids (not shown) may also be deposited over the transparent layer 14 to reduce the effective series resistance of the device. It should be noted that the structure of FIG. 1 may also be inverted if substrate is transparent. In that case light enters the device from the substrate side of the solar cell.

In a thin film solar cell employing a Group IBIIIAVIA compound absorber, the transparent layer 14 often comprises a stack structure comprising a buffer layer 17 and a transparent conductive layer 18 as shown in the inset of FIG. 1, which is a cross-sectional view of a portion 19 of the transparent layer 14. The transparent layer 14, itself may comprise a stack such as an undoped-ZnO/doped-ZnO stack, an undoped-ZnO/In—Sn—O (ITO) stack etc. In manufacturing the cell, the buffer layer 17 is first deposited on the Group IBIIIAVIA absorber film 12 to form an active junction. Then the transparent conductive layer 18 is deposited over the buffer layer 17 to provide the needed lateral conductivity.

Various buffer layers with various chemical compositions have been evaluated in solar cell structures. CdS, ZnS, Zn—S—OH, Zn—S—O—OH, ZnO, Zn—Mg—O, Cd—Zn—S, ZnSe, In—Se, In—Ga—Se, In—S, In—Ga—S, In—O—OH, In—S—O, In—S—OH, etc. are some of the buffer layer materials that have been reported in the literature. Buffer layers for Group IBIIIAVIA devices such as CIGS(S) solar cells are typically 5-200 nm thick and may be deposited by various techniques such as evaporation, sputtering, atomic layer deposition (ALD), electrodeposition and chemical bath deposition (CBD), etc.

Chemical bath deposition (CBD) is the most commonly used method for the formation of buffer layers on CIGS(S) absorber films. The technique involves preparation of a chemical bath comprising the chemical ingredients of the buffer layer to be formed. The temperature of the bath is raised to a typical range of 50-90° C. and the surface of the CIGS(S) film is exposed to the heated bath. Alternately, the substrate containing the CIGS(S) film may be heated and then dipped into the chemical bath kept at a lower temperature as described in U.S. Pat. No. 6,537,845. A thin buffer layer grows onto the CIGS(S) film as a result of homogeneous chemical reactions initiating upon application of heat to the bath and/or to the substrate carrying the CIGS(S) film.

An exemplary CBD process for the growth of a cadmium sulfide (CdS) buffer layer employs a chemical bath comprising cadmium (Cd) species (from a Cd salt source such as Cd-chloride, Cd-sulfate, Cd-acetate, etc.), sulfur (S) species (from a S source such as thiourea) and a complexing agent (such as ammonia, triethanolamine (TEA), diethanolamine (DEA), ethylene diamine tetra-acetic acid (EDTA), etc) that regulates the reaction rate between the Cd and S species. Once the temperature of such a bath is increased to the 50-90° C. range, the reaction between the Cd and S species initiates homogeneously everywhere in the solution. As a result, a CdS layer forms on all surfaces wetted by the heated solution and CdS particles form homogeneously within the solution. The reaction rate between Cd and S species is a function of temperature. The rate increases as the temperature is increased and it decreases as the temperature is reduced.

The prior art CBD processes are batch processes. In other words, in these prior-art methods a pre-measured amount of the bath or solution is used to form a buffer layer on a pre-selected surface area of a structure, such as a solar cell structure. After formation of the buffer layer on the pre-selected surface area of the structure, the used bath is discarded along with the particles formed within the bath. As can be appreciated from this brief review, such prior-art approaches generate large amounts of chemical waste and increase cost since actual materials utilization to form the buffer layer on the surface of the structure is very low, typically lower than 20%. Most of the buffer layer material is wasted on forming a film on the walls of the reactor holding the CBD solution, and on forming particles of the buffer layer material within the solution. The present invention increases materials utilization of the CBD processes, reduces waste, and allows continuous deposition of materials on substrates which may be in the form of rolled foils.

SUMMARY

The present inventions are related to methods and apparatus for fabricating thin film solar cells employing a chemical bath deposited buffer layer.

In one aspect the, present invention is directed to a deposition method which deposits a CdS buffer layer on a surface of a solar cell from a process solution including all chemical components of the CdS buffer layer material. CdS is deposited directly on the absorber layer disposed on the flexible workpiece, which flexible workpiece is conformed to a curve shape to hold the process solution therein and prevent spillage of the process solution onto a backside of the continuous workpiece.

In another aspect, an apparatus that conforms the shape of the flexible workpiece to prevent spillage of the process solution is described.

DETAILED DESCRIPTION OF THE PREFERRED EMBODIMENTS

In one embodiment, the CBD solution is heated when the solution is in contact with the surface to be coated and then the solution is cooled down when it is not in contact with the surface to be coated. The cooled solution may then be re-circulated again over the surface to be coated. This way film formation reaction is accelerated on the surface to be coated and homogeneous nucleation within the solution and on surfaces other than the surface to be coated is minimized and materials utilization is improved.

In another embodiment, substantially all surfaces of the reactor walls are covered with the substrates to be coated and therefore deposition and waste of material on reactor walls is eliminated or reduced in the zone where heat is applied to the solution. Yet in an additional embodiment the solution is continually monitored with a monitoring unit in terms of its chemical composition and filtered. If necessary, species are dosed into the solution to keep its chemical composition substantially the same during long periods of time which may be several hours. This way, waste is minimized, materials utilization is further enhanced and continuous deposition of materials on large number of substrates or long sheets of flexible substrates may be achieved. Various aspects of the present invention will now be described using, as an example, CdS buffer layer deposition on a CIGS(S) absorber surface employing a specific chemistry. It should be noted that various other chemistries may be employed in the present invention to deposit various other buffer layer materials listed before.

An exemplary aqueous CdS deposition bath may be formed by mixing in water 1-50 ml of 1M cadmium salt solution, such as Cd-chloride, Cd-sulfate, Cd-acetate, or the like, 1-50 ml of 14.53 M ammonium hydroxide solution as complexing agent, and 1-50 ml of 1M thiourea as S solution. Another complexing agent solution such as 0.5M Triethanolamine (TEA) may also be added in an amount that is in the range of 1-20 ml . A typical bath may contain (by volume) 5-15% cadmium solution, 5-15% complexing agent (ammonium hydroxide), 5-15% S solution (thiourea) and optionally 5-10% of the additional complexing agent solution (TEA), the balance being the solvent, i.e. water.

The typical CBD electrolytes or solutions are quite stable at low temperatures. Homogeneous reactions within such solutions initiate once the temperature is raised, for example, to over 50° C. A bath may be stable for over 5 hours at 20° C., whereas large particles may form within minutes in a bath that is heated up to 80° C. The above mentioned CdS bath acts in a similar fashion. Since the solution is mostly kept at low temperature for the method of the present invention, it is possible to mix all the ingredients of the solution. In prior art techniques it is customary to mix the Cd source and the complexing agent in the solvent, then heat up the solution to 50° C. or higher, and then add the S source, at which time reaction and CdS formation starts.

Figure 2:
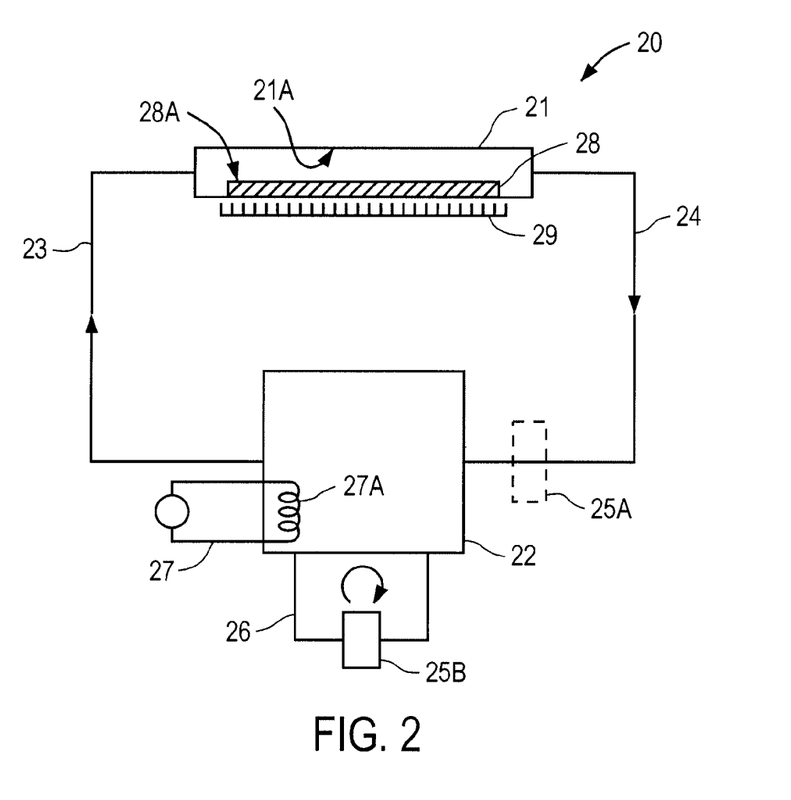
FIG. 2 shows an exemplary buffer layer deposition system.
Figure 2A:
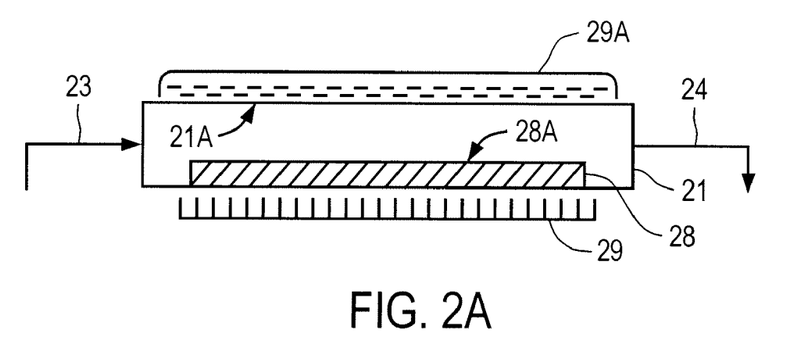
FIG. 2A shows a deposition section employing a heater as well as a cooler.

FIG. 2 is a sketch of a CdS deposition system 20 that may be used to deposit a CdS buffer layer on a surface such as on a CIGS(S) absorber film surface. The CdS deposition system 20 comprises a deposition section 21, a solution container 22, a feed line 23 that carries the solution from the solution container 22 to the deposition section 21 and a return line 24 that carries the solution from the deposition section 21 back to the solution container 22. There may be additional components added to the system 20 of FIG. 2 such as filters 25A on the return line 24, filters (not shown) on the feed line 23, filters 25B on a secondary loop 26 that may circulate the solution within the solution container 22 for the purpose of particle elimination, cooling, mixing etc. There is preferably a cooling loop 27 with a cooling coil 27A within the solution container 22. A cooling liquid may be circulated through the cooling coil 27A to lower the temperature of the bath within the solution container 22. The temperature of the solution within the solution container 22 may be in the range of 5-40° C., preferably in the 15-20° C. range. There is preferably a heater 29 provided to apply heat to a workpiece or structure 28, the exposed surface 28A of which will be coated with CdS. The heater 29 may be a resistance heater, a hot liquid jacket, an infrared lamp heater etc. that is configured to heat up the structure 28 to a process temperature, which may be in the range of 50-90° C. It should be noted that another structure (not shown) and another heater (not shown) may be placed across from the structure 28 so that two such structures are processed face-to-face, at the same time. This way, no CdS deposition is allowed on the exposed wall 21A of the deposition section 21. Yet another design is shown in FIG. 2A. In this case a cooler 29A is provided for the exposed wall 21A of the deposition section 21. This way reaction and deposition of CdS on the exposed wall 21A is greatly reduced or even eliminated. In effect the deposition section 21 becomes a cold-wall reactor where only the wall carrying the structure to be coated with CdS is heated. Other walls are cooled down to keep them clean of CdS deposit.

The apparatus design and the process approach described with respect to FIGS. 2 and 2A heat the solution when it is in contact with the exposed surface 28A of the structure 28. The temperature of the solution contacting the exposed surface 28A may be in the range of 50-90° C., preferably in the range of 55-80° C. The temperature of the solution in the solution container 22, on the other hand may be in the range of 15-20° C. As described before, the solution in the solution container 22 may be cooled down to this temperature range using the secondary loop 26 and/or the cooling loop 27. Alternately, there may be cooler integrated with the return line 24. In this case as the heated solution exits the deposition section 21 and passes through the return line 24 it gets cooled down on its way to the solution container 22. Such an approach is attractive since it cools down the walls of the tubes or other fluid carrier containing the heated solution from the deposition section 21, therefore, reduces or eliminates CdS deposition on such walls.

It should be noted that the preferred method of depositing the CdS layer on the exposed surface 28A (which may be an exposed surface of a CIGS(S) absorber film) of the structure 28 (which may be a substrate/contact layer/CIGS(S) structure) involves direct heating of the structure 28 and thus heating a micro-layer of solution touching the exposed surface 28A. This way, CdS powder formation in the bulk of the solution may be reduced or avoided and deposition primarily takes place on the exposed surface 28A. Such an approach yields very high materials utilization which may be close to 100%. Cooling the solution and re-cycling over the structure is attractive since it allows filtering of formed particles, better uniformity due to controlled liquid flow over the substrate and less chemical waste.

Another method employs heater (not shown) on the feed line 23 so that the solution may be heated to a pre-determined process temperature value before entering the deposition section 21. In this case the heater 29 may or may not be utilized to further heat the structure 28. Similar to the method discussed before, upon exiting the deposition section 21 the solution may be cooled down to a temperature which is lower than the process temperature to reduce powder formation and deposition on the walls of the system. Such temperature lowering may be done within the return line 24 and/or within the solution container 22.

The concepts discussed above have the following unique features that resolve some of the problems associated with prior-art techniques; i) the deposition bath or solution is heated to a process temperature, which may be in the range of 50-90° C., right before it wets the surface to be coated with CdS or during the period when it wets the surface to be coated with CdS, ii) the solution is cooled down to a temperature lower than the process temperature after it is used to coat the surface with CdS, iii) the steps of i) and ii) are repeated either for depositing thicker CdS on the same surface or for depositing CdS on surfaces of new structures introduced into the deposition section in a cyclic or continuous manner. The preferred method involves continuous recycling of the solution between the solution container 22 and the deposition section 21, although intermittent flow of the solution between the deposition section 21 and the solution container 22 may also be utilized. Once the solution is in the solution container 22 it may be analyzed for its composition and ingredients that may be reduced due to reactions may be added to the solution. Such ingredients include but are not limited to water, ammonia, Cd salt, S source, complexing agent etc. By controlling the solution composition this way, the same solution may be used for coating a large number of structures with CdS without replacing the base solution. This reduces waste and thus cost of the process. The base solution may be occasionally replaced with a fresh one if its impurity content increases to a level that may affect the quality of the deposited CdS film. Removal of particles from the solution may be achieved through filtration using various approaches including centrifuging the solution. The CdS particles thus removed may be re-cycled later to form a Cd source for the process.

Figure 3:
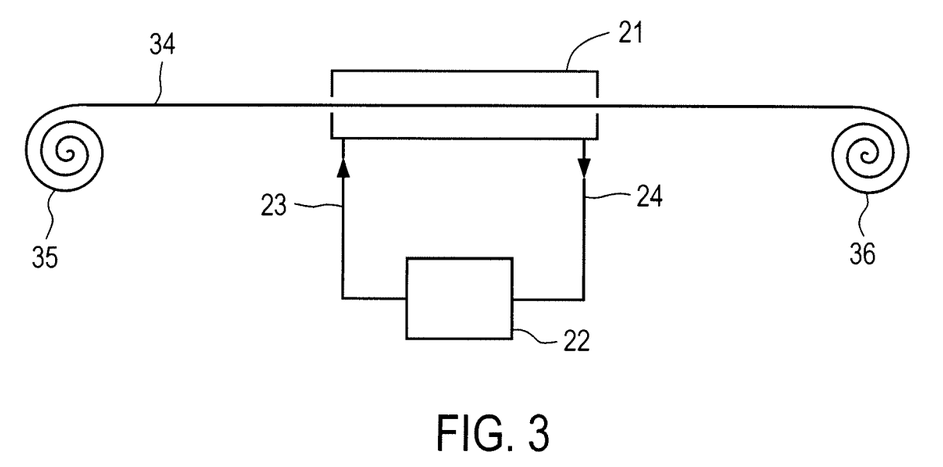
FIG. 3 shows a roll-to-roll deposition system to coat a buffer layer on a flexible structure.

It should be noted that the methods and apparatus of the present inventions are well suited for continuous processing such as roll-to-roll processing. Unlike the batch process approach of prior-art methods that uses a given volume of the solution to deposit CdS on a structure with a pre-selected size and discards the used solution, the present method re-cycles and controls the chemical composition of the solution. Thus various portions of a given structure such as a long (e.g. 1000 ft) foil substrate gets exposed to a repeatable process environment (such as a repeatable solution chemistry and repeatable process temperature), as they are moved through a deposition section, typically at a rate of 100 cm/minute-1000 cm/minute. FIG. 3 schematically shows a roll-to-roll deposition system to coat a buffer layer on a flexible structure 34 that is moved from a supply spool 35 to a take-up spool 36 through a deposition section 21. The CBD solution is circulated between a solution container 22 and the deposition section 21 through a feed line 23 and a return line 24 as described before. The speed of the flexible structure 34 is adjusted to adjust the residence time of a portion of the flexible structure 34 in the deposition section 21. This residence time, along with the temperature and flow rate of the solution, determines the thickness of the buffer layer deposited on that portion of the flexible structure. A typical flow rate of the solution, both into and out of the deposition section 21, is in the range of 0.1 liter/minute to 10 liters/minute.

For roll to roll processing of continuous flexible workpieces, it is preferable to deposit the buffer layer on a front surface of the continuous flexible workpiece by flowing the solution over the front surface while keeping a back surface of the continuous flexible workpiece dry. This may be achieved by shaping the continuous flexible workpiece using a pulling force or an attractive force generated employing a mechanism such as a vacuum or magnets, as will be described next.

Figure 4A:
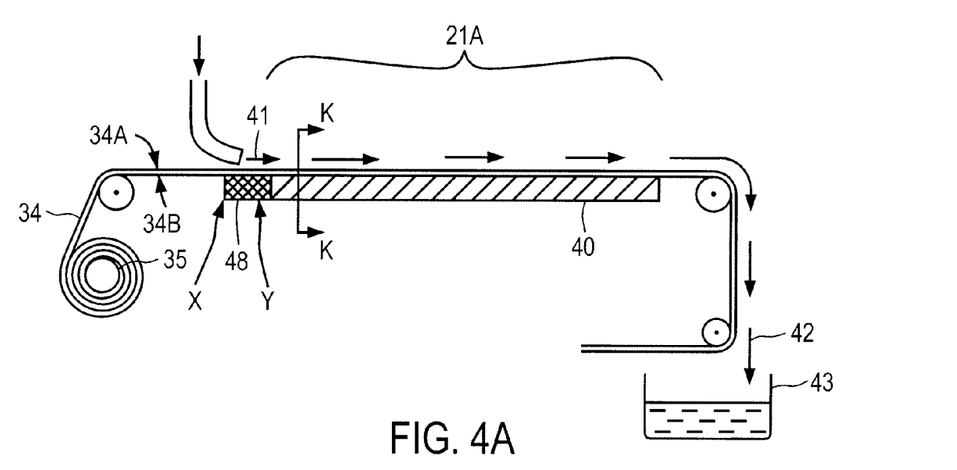
FIG. 4A shows a side view of a deposition chamber with shaped heated wall.

FIG. 4A shows a side cross-sectional view of an exemplary roll-to-roll system with a process section 21A where a buffer layer such as a CdS layer is deposited on a front surface 34A of a continuous flexible workpiece 34 or flexible workpiece hereinbelow.

Figure 4B:
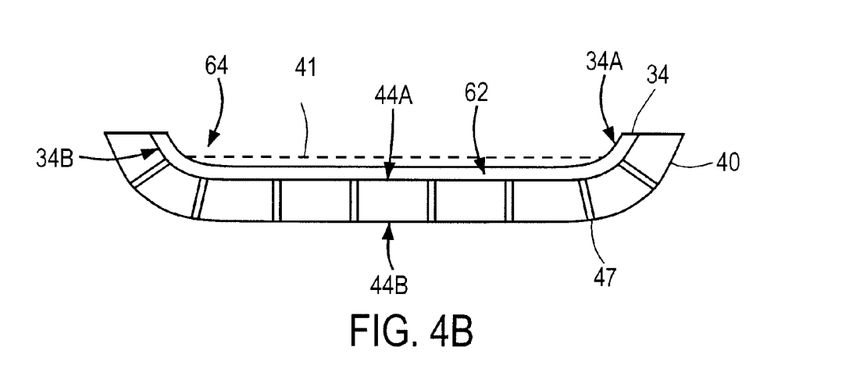
FIG. 4B is a cross-sectional view of the chamber of FIG. 4A taken across the plane K-K.

FIG. 4B shows a cross-sectional view of the process section 21A taken across the line K-K. The process section 21A includes a heated shaping wall 40 or heated shaping plate to elastically shape the flexible workpiece 34 during the deposition process to retain the deposition solution on the front surface 34A of the flexible workpiece 34. As shown in FIG. 4B in this embodiment, a cavity area 62 of the heated shaping wall 40 curves the two long edges of the flexible workpiece upwardly and form a cavity region 64 therebetween to retain a process solution 41 that is dispensed onto its exposed front surface 34A. The bottom of the cavity region 64 is substantially flat for uniform flow of a process solution over it.

During the process, the flexible workpiece 34, which is a flat sheet, is unwound from a supply spool 35 and enters the process section 21A where its back surface 34B is pulled towards the cavity area 62 of the heated shaping wall 40 to bend the long edges of the flexible workpiece 34 upward, thereby forming the workpiece itself into a curved shape or u-shaped configuration with a flat bottom, and thus creating a channel through which the process solution 41 can flow. It is understood that the shaping of the workpiece is elastic in nature so that as soon as the pulling force is removed, the workpiece recovers back to its original flat shape. Pulling of the back surface 34B of the flexible workpiece 34 against the top surface 44A of the heated shaping wall 40 may be achieved by pulling a vacuum through vacuum through-holes 47 or by providing magnets (not shown) which may be placed into the heated shaping wall 40 or mounted below the bottom surface 44B of the heated shaping wall 40. Alternately, the top surface 44A of the heated shaping wall 40 may comprise magnets or magnetic properties. Magnets would be effective only for flexible workpieces comprising a magnetic substrate such as a magnetic steel substrate. A vacuum, on the other hand may be used for all types of flexible workpieces, magnetic or non-magnetic. It should be noted that although the bottom surface 44B of the heated shaping wall 40 is shown to be curved at the edges, it can be flat or any other shape. The top surface 44A of the heated shaping wall 44, however, is shaped so that it is raised at the two long edges as shown in FIG. 4B, thereby forming a u-shaped channel. This way when the process solution 41 is fed onto the front surface 34A of the flexible workpiece 34, which may comprise, for example, an exposed surface of an absorber layer, the solution 41 flows only within the channel formed by the front surface 34A without wetting the back surface 34B of the flexible workpiece 34. It should be noted that an edge region of the flexible workpiece 34 would not be wetted by the process solution 41 and therefore would not be coated with the buffer layer. This edge exclusion region may be 2-10 mm wide along both of the edges of the flexible workpiece 34 and cannot be used for device fabrication.

The buffer layer is deposited from the process solution 41 onto the portion of the front surface 34A of the flexible workpiece 34 wetted by the solution. The height of the process solution 41 flowing over the front surface 34A may be in the range of 0.5-5 mm, preferably in the range of 1-3 mm, and the flow rate may be determined by the inclination angle with respect to the horizontal plane. The inclination angle may be in the range of 5-15 degrees. The amount of bend at the two long edges of the flexible workpiece 34 may be in the range of 2-10 mm, preferably in the range of 3-6 mm so that the process solution 41 is contained over the front surface 34A of the flexible workpiece 34 without spilling over to the back surface 34B of the workpiece 34. After the deposition, the workpiece is moved away from the heated shaping wall 40 and it gradually becomes flat again as the used solution flows out of the front surface 34A. The used solution 42 may then be collected in a container 43 where it can be treated, refurbished or discarded. The processed flexible workpiece may then be cleaned dried and wound onto a take-up spool or receiving spool (not shown).

Figure 4C:
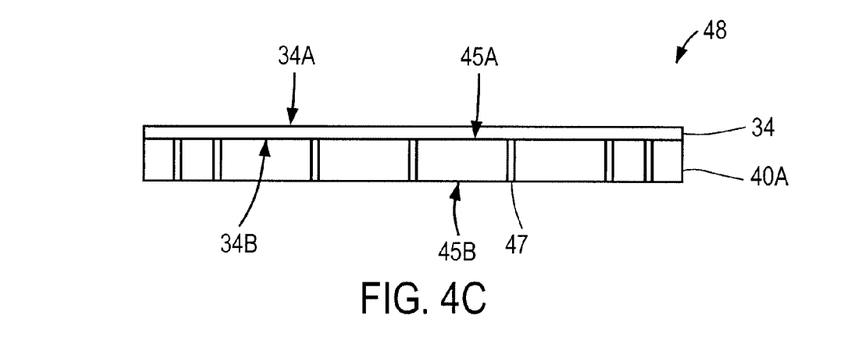
FIG. 4C is a cross sectional view taken at the start of the shaping zone of the chamber of FIG. 4A.

The process section 21A may further comprise a transition wall 48 that extends between locations labeled as "X" and "Y" in FIG. 4A. The transition wall 48 comprises a support plate 40A. The shape of a top surface 45A of the support plate 40A changes from "flat" at location "X" into the "cavity" (similar to the shape of the cavity area 62 of the heated shaping wall 44) at location "Y" to facilitate the shaping of the workpiece into the shape of the cavity from its previous flat state. The cavity section of the support plate may be seen as a portion of the cavity area 62 of heated shaping wall extended into the transition wall 48. FIG. 4C shows the flat shape of the support plate 40A at location "X" where the back surface 34B of the flexible workpiece 34 is first pulled against the top surface 45A of the support plate 40A using a vacuum or magnets as explained before. By first registering a portion of the flexible workpiece 34 onto a flat section of the support plate 40A and then sliding the portion towards and through a cavity section gradually, helps shape the portion of the workpiece without damage by the time it makes contact with the heated shaping wall 40. The heated shaping wall 40 and the transition wall 48 may be connected as two separate pieces or manufactured as a single piece.

In another embodiment a support belt comprises a number of support plate sections that hold and shape the flexible workpiece and travel with it within the process section. In this case when the back surface of the flexible workpiece is held by and in physical contact with a support plate section, there is no relative motion between the flexible workpiece and the support plate section.

Figure 6:
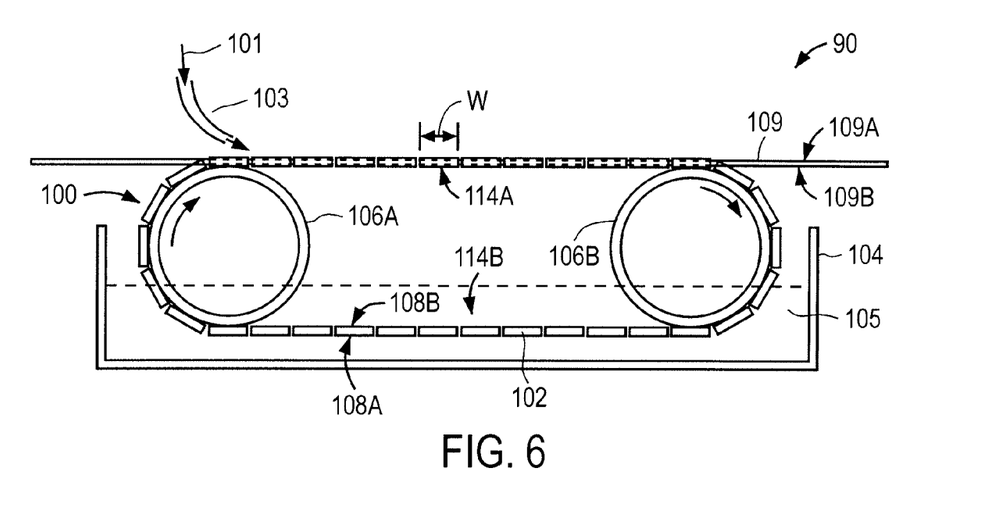
FIG. 6 is a side view of an embodiment of a deposition system with a support plate loop including a plurality of linked support plate sections.
Figure 7A:
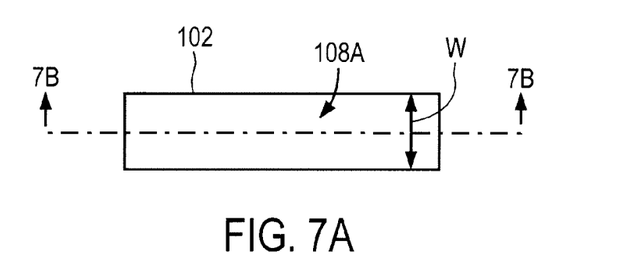
FIG. 7A is a schematic top view of a support plate section shown in FIG. 6.
Figure 7B:
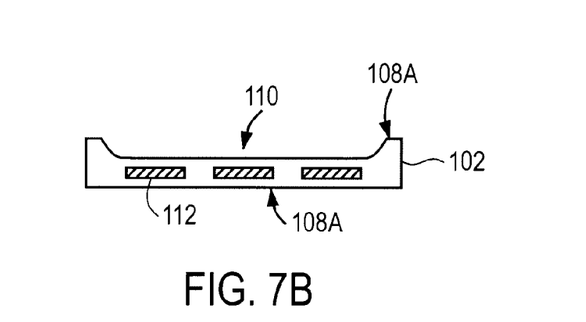
FIG. 7B is a cross sectional view of the support plate section taken along the line 7B-7B.

FIG. 6 shows in side view a deposition system 90 including a support belt 100 and a heating mechanism 104 which may include a heating medium 105 to heat the support belt 100. A deposition solution 101 is flowed on a top surface 109A of the flexible workpiece through a solution dispenser 103. The heating medium 105 may be heated liquid, such as water. Alternately lights or other heating mechanism may be employed. The support belt 100 is shaped as an endless loop by movably linking support plate sections 102 to one another as in the manner shown in FIG. 6. Top surface 108A of each support plate section 102 faces outside the support belt 100 to support a continuous workpiece 109, which may be preferably inclined with respect to the horizontal plane, while the back surface 108B of each support plate section 102 faces the inside of the support belt 100. Width 'W' of each support plate section may be in the range of 10-50 millimeters. As shown in FIGS. 7A and 7B, the top surface 108A of each support plate section 102 has a substantially rectangular shape, and includes a cavity area 110 to shape the continuous workpiece 109 shown in FIG. 6. The length of each support plate section 102 may be equal to, a bit smaller than or a bit larger than the width of the flexible workpiece 109 depending on the depth of the cavity area 110.

The continuous workpiece 109 may be attracted towards the cavity area 110 using, for example, magnets 112 or electromagnets, which may be placed within the support plate sections 102. Alternately, magnets or electromagnets may be placed over the back surface 108B of the support plate sections 102. The support belt 100 may be placed around rollers 106A and 106B. The rollers 106A and 106B may be driven or idle rollers. As shown in FIG. 6, a group of the support plate sections 102 of the support belt 100 contact a back surface of the flexible workpiece 104 when they are in a first position 114A or an upper position, while another group of the support plate sections in a second position 114B or lower position are heated in the heating mechanism 104. Top surfaces 108A of the support plate sections 102 in the first position are coplanar and follow a linear path. The support plate sections 102 in the second position 114B may or may not follow a linear path. When the support plate sections 102 of the support belt 100 are in the second position, they are heated by the heating medium, for example hot water to a temperature which may be in the range of 50-100° C. When heated sections are moved into the first position 114A they come into contact with the back surface 109B of the workpiece 109 and heat, and at the same time shape that portion of the workpiece as described above so that deposition takes place on the front surface of the flexible workpiece 109 while the deposition solution is contained on the front surface by the shape.

Figure 5A:
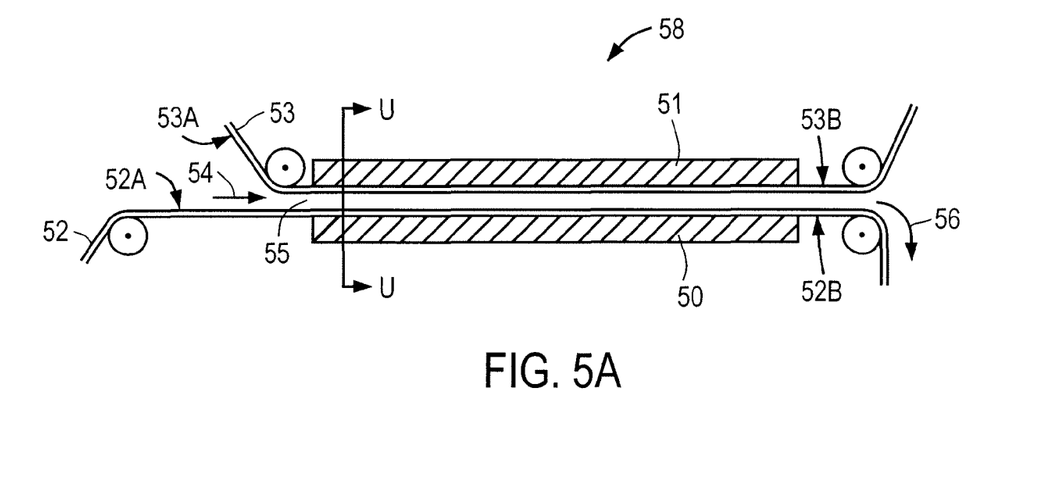
FIG. 5A shows a side view of an exemplary deposition chamber that coats a buffer layer on two flexible workpieces simultaneously.

As discussed with reference to FIG. 2, in one embodiment two structures may be processed in a face-to-face manner. This way, no CdS deposition is allowed on the exposed wall 21A of the deposition section 21 in FIG. 2 and all the deposits are performed on the two face-to-face exposed surfaces of the absorber layers as desired, without much waste. FIG. 5A shows a side view of an exemplary system with a deposition section 58 or chamber that deposits a buffer layer by the chemical bath or electroless method on the exposed surfaces of two absorber layers, simultaneously, the two absorber layers having been formed on two flexible workpieces. A first flexible workpiece 52 and a second flexible workpiece 53 are fed into the chamber 58 from two different supply spools (not shown). A back surface 52B of the first flexible workpiece 52 is supported by a surface of a first heated wall 50, whereas a back surface 53B of the second flexible workpiece 53 is supported by a surface of a second heated wall 51, which is in proximity of and across from the first heated wall 50. As explained above, vacuum suction or magnetic forces may be used to keep the two workpieces engaged against the surfaces of the two heated walls. A front surface 52A of the first flexible workpiece 52 and a front surface 53A of the second flexible workpiece 53 face each other forming a process gap 55. A cross-sectional view of the chamber 58 taken along the line U-U is shown in FIG. 5B.

Figure 5B:
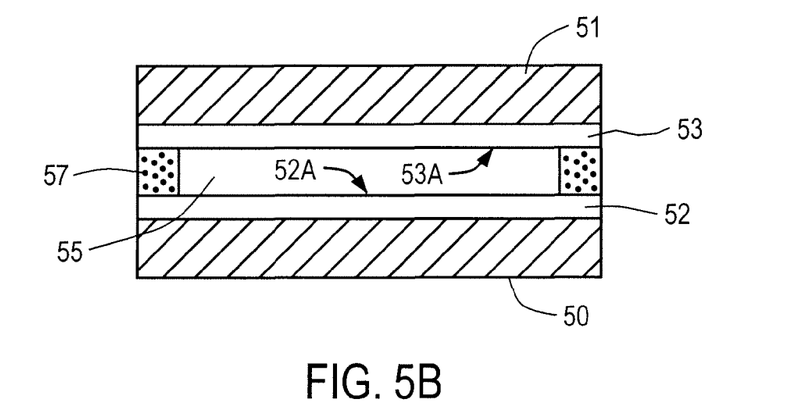
FIG. 5B is a cross-sectional front view of the chamber of FIG. 5A taken across the plane U-U.

As shown in FIG. 5B, the process gap 55 is defined by the front surface 52A of the first flexible workpiece 52, the front surface 53A of the second flexible workpiece 53 and the two sealing members 57 near the long edges of the flexible workpieces. During process, as the first flexible workpiece 52 and the second flexible workpiece 53 are moved from two different supply spools (not shown) and through the chamber 58 a process solution 54 is flown into the process gap 55. As the process solution 54 flows through the process gap 55, it deposits the buffer layer on the front surface 52A of the first flexible workpiece 52 and the front surface 53A of the second flexible workpiece 53, simultaneously. As described before, both front surfaces may comprise solar cell absorber layers and the buffer layer may be deposited onto the two absorber layers. It should be noted that, in this embodiment, the total area of the workpiece front surfaces wetted by the process solution is much larger, e.g. 1000 times or more, than the area of the surfaces of the sealing members wetted by the process solution. Consequently, the buffer layer is basically deposited on surfaces where it is needed. Very little amount gets wasted through deposition on the wetted surfaces of the sealing members 57. The used solution 56 flows out of the chamber 58 and may be collected in a tank (not shown) as described before.

It should be noted that the height of the process gap 57 may be in the range of 0.5-5 mm, preferably in the range of 1-3 mm, whereas the width of the workpieces employed may be in the range of 0.3-2 m. For a 1 mm gap and 1 m wide workpiece, the ratio of the wetted workpiece total front surface area to the wetted sealing member total area is about 200 cm/0.2 cm=1000. By minimizing the height of the process gap 57, maximizing the width of the flexible workpieces and minimizing the speed of the process solution flow, the utilization of materials in the process solution may be maximized and the waste may be minimized. The angle of the heated walls against horizontal may be as high as 90 degrees but it is preferably in the range of 5-20 degrees. This value of the angle may be varied to optimize the process results. During processing the heated walls of the system shown in FIGS. 5A and 5B are stationary and the flexible workpieces move. As for the sealing members 57, they may be stationary or moving. In one embodiment, the sealing members 57 may be stationary and the first flexible workpiece 52 and the second flexible workpiece 53 may move with respect to the sealing members 57. In another embodiment the two sealing members 57 such as soft O-rings made from elastic materials such as rubber, silicon etc., may be continually fed into the gap between the first flexible workpiece 52 and the second flexible workpiece 53 along the two long edges of the two workpieces, at a speed that is substantially equal to the linear speed of the two flexible workpieces. In this case there would be no relative motion between the sealing members 57 and the two flexible workpieces during processing.

One special factor influencing the improved materials utilization of the present embodiment is the sealed nature of the process gap 55. The commonly used process solutions, such as solutions employed for CdS deposition, comprise volatile species such as ammonium hydroxide. Such volatile species, while flowing over exposed large area surfaces, vaporize easily and leave the process solution. Once such species are lost from the process solution, the deposition rate of the buffer layer drops drastically since ammonia is an important ingredient to control deposition. In the design of FIGS. 5A and 5B, the process solution and its volatile species are trapped in the process gap 55, and therefore the volatile species cannot vaporize and leave the solution until the used solution 56 emerges from the end of the chamber 58. As a result, the deposition rate of the buffer layer within the gap is maximized without any loss of the volatile solution species. This increased deposition rate as well as processing two flexible workpieces simultaneously, more than doubles the throughput of the present method and the tool over other approaches. It should be noted that during processing, the motion of the flexible workpieces may be in the same direction as the flow of the process solution. Alternately, the flexible workpieces may be moved in a direction that is opposite to the direction of the process solution flow.

One other positive aspect of the face-to-face processing method and apparatus described above is the inherit uniformity of the process results on two flexible workpieces. Since the process gap between the front surfaces of the two flexible workpieces is small, when a process solution is introduced into this gap, the surface tension of the solution distributes it over the two surfaces very uniformly. The process gap is thus completely filled with the process solution provided enough solution is supplied into the gap. Since the process gap can be made very uniform in height, the thickness of the process solution over the front surfaces of the first and the second flexible workpieces is always constant. This improves the uniformity of the deposited buffer layers and the repeatability of the deposition process.

Although the present invention is described with respect to certain preferred embodiments, modifications thereto will be apparent to those skilled in the art.

We claim:

1. A method of depositing a buffer layer material from a solution to an exposed surface of a solar cell absorber layer disposed on a continuous flexible workpiece for manufacturing solar cells as the continuous flexible workpiece is advanced through a roll-to-roll system, comprising:

advancing a section of the continuous flexible workpiece from a supply roll and having a flat shape onto a heated plate including a cavity area, wherein the cavity area of the heated plate is configured to elastically alter the section of the continuous flexible workpiece into a curved shape that conforms to the cavity area of the continuous flexible workpiece;

flowing a supply solution over an exposed surface of the solar cell absorber layer of the curved-shape section of the continuous flexible workpiece, wherein the supply solution is maintained at a first temperature before flowing into the section of the continuous flexible workpiece that conforms to the cavity area of the heated plate with the curved shape and wherein the supply solution includes all the chemical components of the buffer layer material;

heating, to a second temperature which is higher than the first temperature, the continuous flexible workpiece and the solar cell absorber layer using the heated plate when the section of the continuous flexible workpiece is within the cavity area and conforming to the cavity area with the curved shape, wherein the heating of the continuous flexible workpiece and the absorber layer cause the transfer of heat from the solar cell absorber layer to at least a portion of the solution that is in contact with the exposed surface of the solar cell absorber layer and to cause depositing of the buffer layer material within the solution onto the exposed surface of the solar cell absorber layer; and moving the section of the continuous flexible workpiece away from the cavity areas of the heated plate so that the section of the continuous flexible workpiece flattens.

2. The method of claim 1 further comprising wrapping up the flattened continuous flexible workpiece around a receiving roll after the step of moving.

3. The method of claim 1, wherein the first temperature is in the range of 15-40 ° C. and the second temperature is in the range of 50-90° C.

4. The method of claim 1, wherein the solution that forms the buffer layer material comprises at least one of Cd, Zn and In in addition to a sulfur source.

5. The method of claim 1 wherein the heated plate further comprises a transition area between the supply roll and the cavity area of the heated plate; and wherein the step of advancing the section of the continuous flexible workpiece includes advancing the section over the transition area to aid in conforming the flexible workpiece into the curved shape.

6. The method of claim 1, wherein the heated plate is configured to elastically alter the section of the continuous flexible workpiece into the curved shape that conforms to the cavity area using an attractive force induced by a magnetic field.

7. The method of claim 6, wherein the continuous flexible workpiece includes a magnetic substrate.

8. The method of claim 1, wherein the heated plate is configured to elastically alter the section of the continuous flexible workpiece into the curved shape that conforms to the cavity area using an attractive force induced by vacuum.

9. The method of claim 8, wherein the continuous flexible workpiece includes one of a magnetic substrate and a non-magnetic substrate.

* * * * *